United States Patent
Abe et al.

(10) Patent No.: US 10,049,854 B2
(45) Date of Patent: Aug. 14, 2018

(54) CHARGED PARTICLE BEAM LENS APPARATUS, CHARGED PARTICLE BEAM COLUMN, AND CHARGED PARTICLE BEAM EXPOSURE APPARATUS

(71) Applicant: INTEL CORPORATION, Santa Clara, CA (US)

(72) Inventors: Tomohiko Abe, Gunma (JP); Shinichi Kojima, California, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/335,448

(22) Filed: Oct. 27, 2016

(65) Prior Publication Data
US 2017/0213689 A1    Jul. 27, 2017

(30) Foreign Application Priority Data

Jan. 26, 2016   (JP) ................................ 2016-012798

(51) Int. Cl.
*H01J 37/14*    (2006.01)
*H01J 37/317*   (2006.01)
*H01J 37/141*   (2006.01)

(52) U.S. Cl.
CPC ............ *H01J 37/14* (2013.01); *H01J 37/141* (2013.01); *H01J 37/3174* (2013.01); *H01J 2237/002* (2013.01)

(58) Field of Classification Search
CPC ................. H01J 37/14; H01J 37/3174; H01J 2237/002; G21K 5/00; G21K 5/04; G21K 5/10; G21K 2201/00; G21K 2201/065; G21K 2201/067
USPC ...................................... 250/396 R, 397, 398
See application file for complete search history.

(56) References Cited

U.S. PATENT DOCUMENTS

2005/0157269 A1   7/2005   Seto et al.
2012/0261573 A1   10/2012  Adamec
(Continued)

FOREIGN PATENT DOCUMENTS

JP    S57140169 A    8/1982
JP    S57140169 U    9/1982
(Continued)

OTHER PUBLICATIONS

Akio Yamada et al."Evaluation of Throughput Improvement by MCC and CP in Multicolumn E-beam Exposure System" Proc. SPIE 7637, Alternative Lithographic Technologies II, 76370C, Mar. 10, 2010.
Office Action issued for counterpart Korean Application 10-2016-0141442, issued by the Korean Intellectual Property Office dated Aug. 17, 2017.
(Continued)

*Primary Examiner* — Nicole Ippolito

(57) ABSTRACT

Provided is a charged particle beam lens apparatus having a small size and high resolution, and a charged particle beam column and a charged particle beam exposure apparatus.
A charged particle beam lens apparatus includes a lens unit positioned around a through hole through which a charged particle beam travels, where the lens unit is configured to converge or diffuse the charged particle beam, and a supporting unit surrounding the lens unit. Here, at least one of an outer peripheral portion of the lens unit that is in contact with the supporting unit and an inner peripheral portion of the supporting unit that is in contact with the lens unit includes a groove through which a coolant fluid flows along an outer periphery of the lens unit.
In this way, the charged particle beam lens apparatus can achieve a small size and high resolution.

16 Claims, 15 Drawing Sheets

(56) References Cited

U.S. PATENT DOCUMENTS

| | | |
|---|---|---|
| 2013/0011796 A1 | 1/2013 | Hirata |
| 2013/0187046 A1 | 7/2013 | Zeidler et al. |
| 2014/0166893 A1 | 6/2014 | Yamada |
| 2015/0124229 A1* | 5/2015 | Van Veen ................ H01J 37/09 355/30 |

FOREIGN PATENT DOCUMENTS

| | | |
|---|---|---|
| JP | S60245132 A | 12/1985 |
| JP | S61-227356 A | 10/1986 |
| JP | 2007335134 A | 12/2007 |
| JP | 2015008078 A | 1/2015 |

OTHER PUBLICATIONS

Extended European Search Report for European Patent Application No. 16195044.9, issued by the European Patent Office dated May 29, 2017.

Office Action issued for counterpart Taiwanese Application 105134224, issued by the Taiwan Intellectual Property Office dated Nov. 23, 2017.

Notice of First Office Action for Patent Application No. 201610958663.3, issued by the State Intellectual Property Office of the People's Republic of China dated Apr. 3, 2018.

\* cited by examiner

CHARGED PARTICLE BEAM LENS APPARATUS, CHARGED PARTICLE BEAM COLUMN, AND CHARGED PARTICLE BEAM EXPOSURE APPARATUS

The contents of the following Japanese patent application are incorporated herein by reference:
NO. 2016-012798 filed on Jan. 26, 2016.

BACKGROUND

1. Technical Field

The present invention relates to a charged particle beam lens apparatus, a charged particle beam column, and a charged particle beam exposure apparatus.

2. Related Art

In the conventional art, complementary lithography is known according to which line patterns are formed by photolithography techniques and then processed using charged particle beams such as electron beams (see, for example, Japanese Patent Application Publication No. 2013-16744). In addition, it is known that a charged particle beam exposure apparatuses includes a plurality of charged particle beam columns arranged next to each other, each including charged particle beam lenses (see, for example, Proc. SPIE 7637, Alternative Lithographic Technologies II, 76370C (Mar. 10, 2010)). Also, it is known that charged particle beam lenses include heat eliminating units (see, for example, Japanese Patent Application Publications Nos. 61-227356 and 2014-120545).

Since such an exposure apparatus has a plurality of charged particle beam columns arranged therein, the lens sizes are limited. It is thus difficult for such an exposure apparatus to achieve high resolution while keeping the beam current value. High resolution can be accomplished by increasing the excitation current for the charged particle beam lenses to strongly excite the lenses. This, however, increases the heat generated by the charged particle beam lenses. To deal with the generated heat, the charged particle beam lenses may be provided with heat eliminating mechanisms and the like. This disadvantageously increases the sizes of the charged particle beam lenses. Considering the above, small charged particle beam lenses with high resolution are demanded.

For example, the following heat eliminating units have been proposed for the charged particle beam lenses. Firstly, double-layered components are introduced and cooling liquids are fed into the gap between the layers (see, for example, Japanese Patent Application Publication No. 61-227356). Secondly, a container having an excitation unit sealed therein is prepared and a cooling liquid is circulated in the container (see, for example, Japanese Patent Application Publication No. 2014-120545). These approaches, however, require addition of the new components to the charged particle beam lenses to form the cooling liquid flow channels. Thus, the charged particle beam lenses grow in size by the widths of the added components.

SUMMARY

Therefore, it is an object of an aspect of the innovations herein to provide a charged particle beam lens apparatus, a charged particle beam column and a charged particle beam exposure apparatus, which are capable of overcoming the above drawbacks accompanying the related art. The above and other objects can be achieved by combinations described in the claims. A first aspect of the innovations herein may include a charged particle beam lens apparatus including a lens unit positioned around a through hole through which a charged particle beam travels, where the lens unit is configured to converge or diffuse the charged particle beam and a supporting unit surrounding the lens unit. Here, at least one of an outer peripheral portion of the lens unit that is in contact with the supporting unit and an inner peripheral portion of the supporting unit that is in contact with the lens unit includes a groove through which a coolant fluid flows along an outer periphery of the lens unit.

A second aspect of the innovations herein may include a charged particle beam lens apparatus including a lens unit positioned around a through hole through which a charged particle beams travels, where the lens unit is configured to converge or diffuse the charged particle beam and a supporting unit surrounding the lens unit. Here, the lens unit includes a first member positioned around the through hole and a second member surrounding the first member, and at least one of an outer peripheral portion of the first member that is in contact with the second member and an inner peripheral portion of the second member that is in contact with the first member includes a groove through which a coolant fluid flows along an outer periphery of the first member.

A third aspect of the innovations herein may include charged particle beam column including a particle source configured to emit a charged particle beam and the charged particle beam lens apparatus relating to one of the first and second aspects of the innovations herein.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

The following first describes how the lens characteristics of electron beam lenses are related to the heat generated by the lenses and the heat eliminating unit for the electron beam lenses.

Figure 11A:
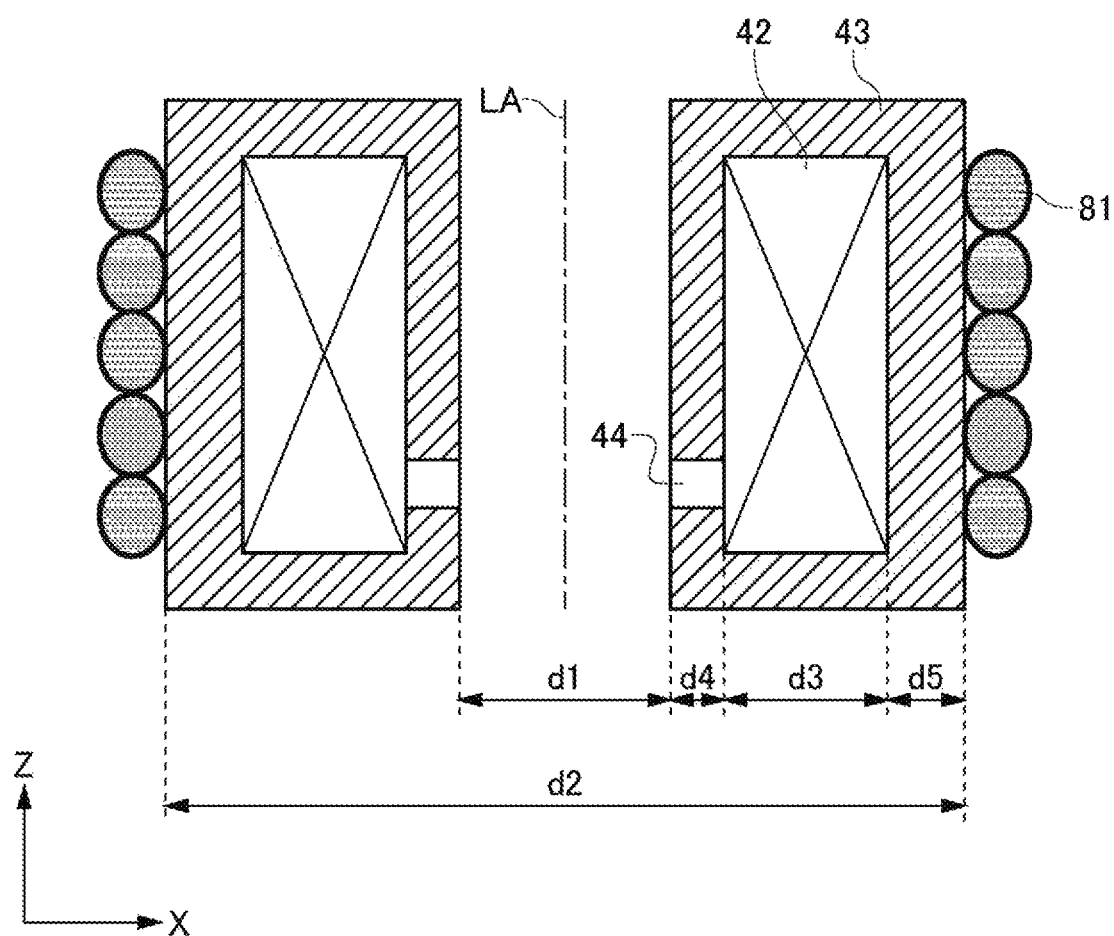
FIG. 11A is a cross-sectional view showing first exemplary electron beam lens and heat eliminating unit.
Figure 11B:
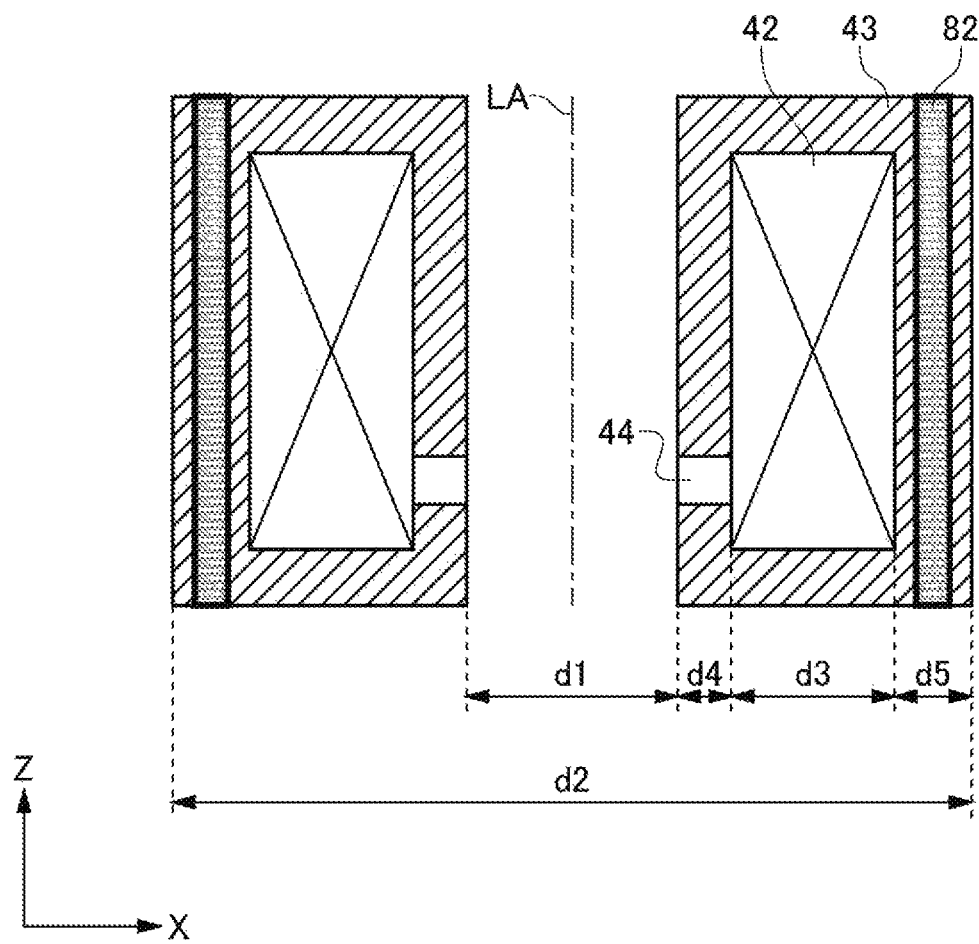
FIG. 11B is a cross-sectional view showing second exemplary electron beam lens and heat eliminating unit.
Figure 11C:
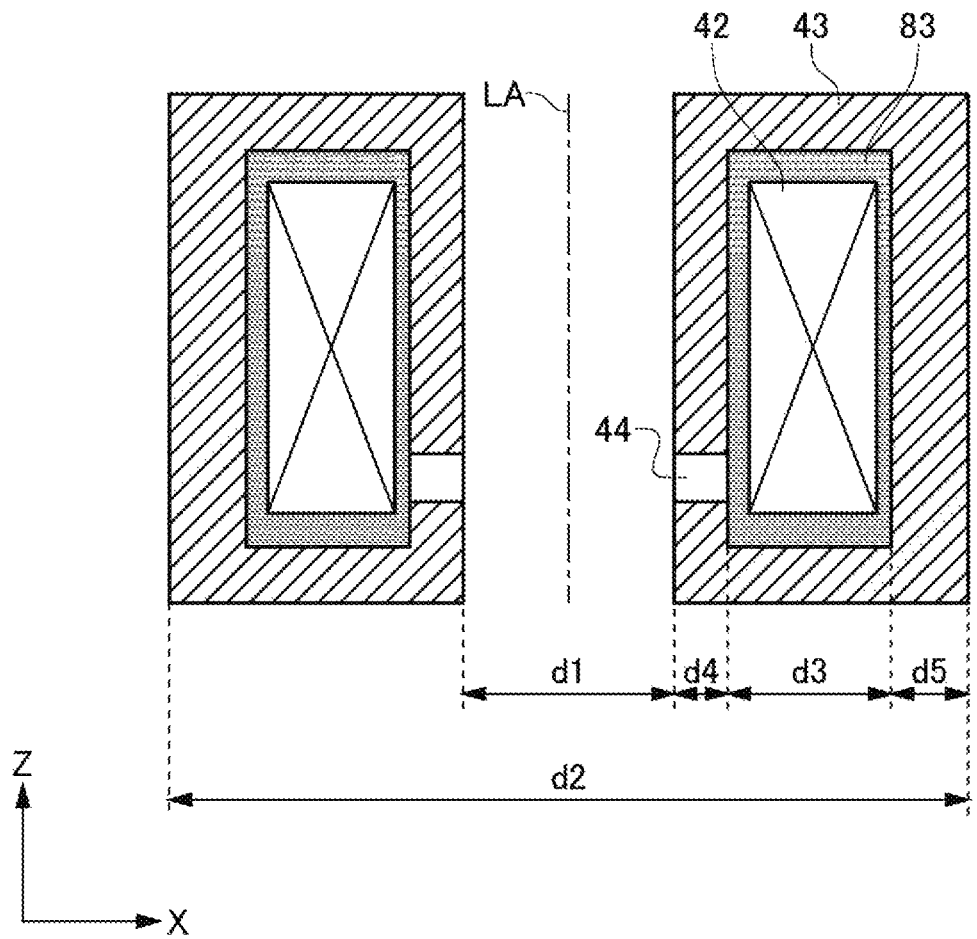
FIG. 11C is a cross-sectional view showing third exemplary electron beam lens and heat eliminating unit.

FIG. 11A is a cross-sectional view showing first exemplary electron beam lens and heat eliminating unit. FIG. 11B is a cross-sectional view showing second exemplary electron beam lens and heat eliminating unit. FIG. 11C is a cross-sectional view showing third exemplary electron beam lens and heat eliminating unit. As is shown in each drawing, the components of the electron beam lens are arranged axisymmetrically around an axis LA that is indicated by the dot-and-dash line and parallel to the Z-axis. The electron beam lens includes an excitation unit 42, a magnetic member 43, and a gap 44. An electron beam passes through the electron beam lens along the symmetrical axis LA, for example. The excitation unit 42 is a coil that is wound around the axis LA. The excitation unit 42 generates magnetic field on the axis LA in the extending direction of the axis LA in response to currents flowing around the axis LA.

The magnetic member 43 causes the magnetic field excited by the excitation unit 42 to converge toward the vicinity of the gap 44. In the above-described manner, the axis LA serves as the lens axis for the electron beam lens as shown in FIGS. 11A, 11B and 11C. The width d1 represents the inner diameter of the through hole of the electron beam lens through which an electron beam passes along the lens axis LA. The width d2 represents the outer diameter of the electron beam lens that is shaped like a cylinder centering around the lens axis LA.

Figure 12:
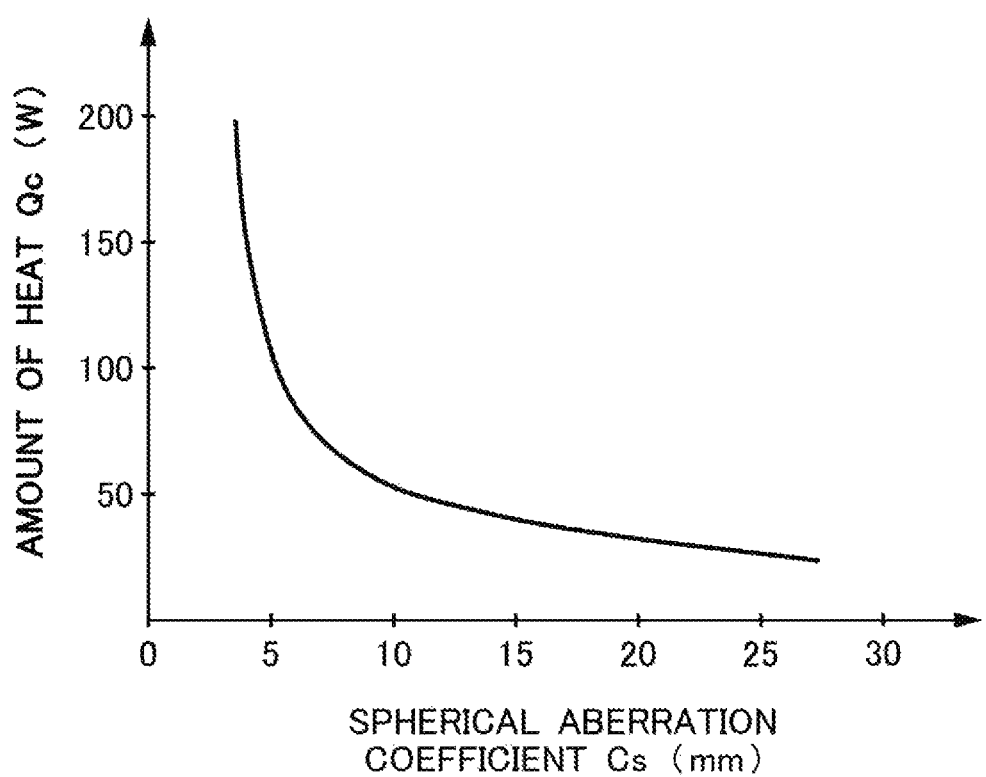
FIG. 12 shows a graph illustrating how the spherical aberration coefficient Cs of an electron beam lens is related to the amount of the heat Qc generated by the electron beam lens.

Regarding an electron beam column using the above-described electron beam lens as its objective lens, the relation between the spherical aberration coefficient Cs, which is a basic parameter determining the lens resolution, and the amount of the heat Qc generated by the current flowing through the coil of the excitation unit 42 was studied. Here, the spherical aberration coefficient Cs is determined in such a manner that $Cs \times \alpha^3$ represents the aberration of the electron beam lens when a denotes the convergence half angle of the electron beam lens. FIG. 12 shows a graph illustrating how the spherical aberration coefficient Cs of the electron beam lens is related to the amount of the heat Qc generated by the electron beam lens. In FIG. 12, the horizontal axis represents the spherical aberration coefficient Cs and the vertical axis represents the amount of the heat Qc generated by the electron beam lens. FIG. 12 shows a graph illustrating the relation between the spherical aberration coefficient Cs and the amount of the heat Qc observed when the shapes and sizes of the excitation unit 42, the magnetic member 43 and the gap 44 are optimized to obtain smaller spherical aberration coefficients Cs with smaller amounts of the heat Qc.

The graph shown in FIG. 12 presents, as an example, the results obtained under such conditions that the acceleration voltage of the electron beam is 50 KV, the inner diameter d1 of the magnetic member 43 is φ8 mm and the outer diameter d2 of the magnetic member 43 is φ28 mm. The conditions additionally include the cross-sectional width of the coil windings of the excitation unit 42 in the moving radius direction (for example, represented by d3 in FIG. 11A) being set to 4 mm or less, and the cross-sectional width of both the inner (close to the lens axis LA, for example, represented by d4 in FIG. 11A) and outer (distant from the lens axis LA, for example, represented by d5 in FIG. 11A) portions of the magnetic member 43 in the moving radius direction being set to 3 mm or less.

In FIG. 12, the amount of the heat Qc and the spherical aberration coefficient Cs are calculated through simulations by setting the respective parameters of the electron beam lens at various levels and the results are plotted. The parameters of the electron beam lens include the cross-sectional shape and length in the Z-axis direction of the windings of the excitation unit 42, the cross-sectional shape and length in the Z-axis direction of the magnetic member 43 surrounding the excitation unit 42, the position and size of the gap 44, the distance between the lower surface of the lens through which the beam exits and the image formation plane on the sample, and the like. Here, the exemplary graph shown in FIG. 12 is created based on the plotted results calculated for various values of the respective parameters by connecting the points indicating that smaller spherical aberration coefficients Cs are obtained with smaller amount of the heat Qc, in other words, the points closer to the vertical and horizontal axes.

The graph in FIG. 12 reveals that, when the spherical aberration coefficient Cs of the electron beam lens is 5 mm or less, the amount of the heat Qc generated by the electron beam lens is 100 W or higher. Here, the spherical aberration coefficient Cs of 5 mm or less means that the aberration calculated as $Cs \times \alpha^3$ is, for example, 5 nm or less when the electron beam lens causes the electron beams whose convergence half angle α is, for example, 10 mrad to converge.

In other words, the above-described study provides, as an example, the requirements for the electron beam lens to achieve predetermined resolution while accomplishing a sufficient beam current value when the electron beam lens causes an electron beam having an convergence half angle α of 10 mrad to converge. That is to say, the above-mentioned simulation results indicate that the electron beam lens needs to eliminate heat of at least 100 W in order to keep the spherical aberration coefficient Cs to be 5 mm or less and to keep the temperature of the electron beam lens at, for example, 50° C. or lower.

FIGS. 11A, 11B and 11C show exemplary heat eliminating units for the electron beam lens. The exemplary heat eliminating unit shown in FIG. 11A is provided by winding a tube 81 around the outer periphery of the magnetic member 43 like a coil. The heat eliminating unit shown in FIG. 11A is configured to bring the external wall of the magnetic member 43 into contact with the tube 81 to eliminate the heat generated by the electron beam lens by means of the coolant fluid circulating through the tube 81. It has been found that the heat eliminating unit shown in FIG. 11A is less capable of eliminating heat than the heat eliminating units described with reference to FIGS. 11B and 11C and has difficulties in keeping the temperature of the electron beam lens within a predetermined range if the electron beam lens generates heat of 100 W or higher. In addition, the electron beam lens has an increased size due to the size of the tube 81 in the example shown in FIG. 11A.

The exemplary heat eliminating unit shown in FIG. 11B includes a through hole 82 in the magnetic member 43. The heat eliminating unit shown in FIG. 11B is configured to eliminate the heat generated by the electron beam lens by bringing the coolant fluid circulating through the through hole 82 into direct contact with the magnetic member 43 with the wall of the through hole 82 therebetween. Regarding the heat eliminating unit shown in FIG. 11B, the diameter and number of the through holes 82 may be adjusted in order to keep the temperature of the electron beam lens, which generates heat of 100 W or higher, within a predetermined range. Such adjustments have revealed that the electron beam lens can hardly be realized unless the magnetic member 43 has a large size, in particular, unless the cross-sectional width d5 of the magnetic member 43 in the moving radius direction is large.

The exemplary heat eliminating unit shown in FIG. 11C has a container 83 that houses therein the excitation unit 42, in the internal space within the magnetic member 43. The heat eliminating unit shown in FIG. 11C is configured to eliminate the heat generated by the electron beam lens by immersing the excitation unit 42 in the coolant fluid circulating within the container 83. In the heat eliminating unit shown in FIG. 11C, the excitation unit 42 through which currents flow is in direct contact with the coolant fluid. This may cause electrical leakage from the excitation unit 42 to the coolant fluid and corrosion of the excitation unit 42 due to the contact between the excitation unit 42 and the coolant fluid, which may make the lens behavior unstable. In addition, it is difficult to allow currents to stably flow through the excitation unit 42 while the coolant fluid is circulated.

As described above, electron beam lenses have difficulties in keeping its temperature within a predetermined range if the electron beam lenses are small and generate heat of 100 W or higher. The following describes a charged particle beam lens apparatus relating to an embodiment of the present invention that can keep the temperature of the electron beam lens within a predetermined range even if the electron beam lens is small and generates heat of 100 W or higher.

Figure 1:
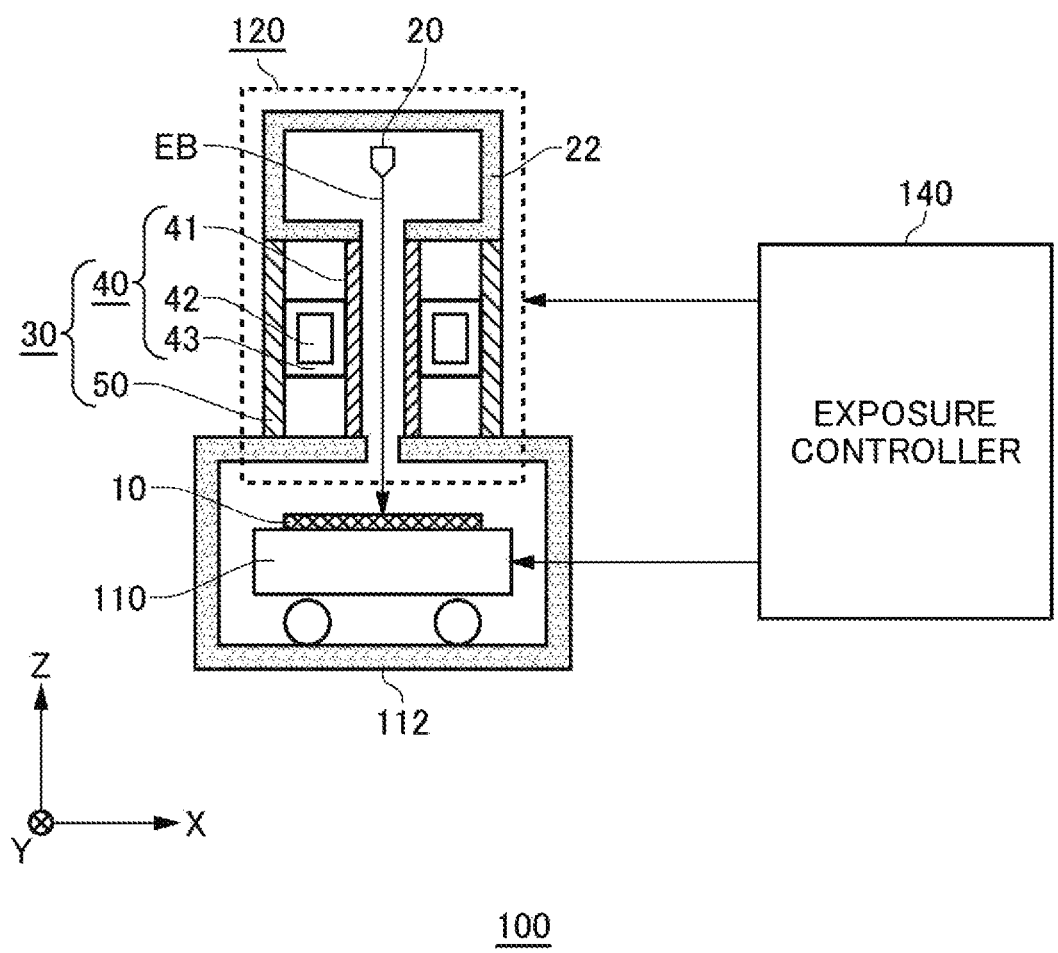
FIG. 1 shows an exemplary structure of an electron beam exposure apparatus 100 relating to an embodiment of the present invention.

FIG. 1 shows an exemplary structure of an electron beam exposure apparatus 100 relating to an embodiment of the present invention. The electron beam exposure apparatus 100 is configured to, for example, apply charged particle beams to sites corresponding to the line patterns formed with a predetermined pitch on a sample, in order to form cut patterns and via patterns on the line patterns by electron beam lithography techniques. The electron beam exposure apparatus 100 includes a stage 110, a column 120 and an exposure controller 140. The stage 110 is installed within a vacuum vessel 112.

The stage 110 is configured to have a sample 10 placed thereon. Here, the sample 10 may be a substrate made of, for example, semiconductors, glass and/or ceramic, for example, a semiconductor wafer made of silicon or the like. The sample 10 is a substrate having line patterns of electric conductors such as metals formed on the surface thereof. The electron beam exposure apparatus 100 relating to the present embodiment is configured to apply electron beams to the resist formed on the line patterns in order to, for example, cut off the line patterns and perform microfabrication (form electrodes, interconnections and/or vias, for example).

The stage 110 moves the sample 10 on the XY-plane shown in FIG. 1. The stage 110 may be an XY-stage or a combination of an XY-stage and one or more of a Z-stage, a rotation stage and a tilt stage.

The column 120 is a charged particle beam column configured to apply a charged particle beam containing electrons and ions to the sample 10 placed on the stage 110. The column 120 applies a charged particle beam containing electrons and ions onto the surface of the sample 10 within a mobile range of the stage 110. In the present embodiment, an example is described where the column 120 applies an electron beam. The column 120 of the present embodiment generates, for example, an electron beam to cut off the line patterns formed on the sample 10 and perform microfabrication.

The column 120 includes an electron source 20 and an electron beam lens apparatus 30. The electron beam lens apparatus 30 has a lens unit 40 and a supporting unit 50. The lens unit 40 is constituted by a barrier 41, an excitation unit 42 and a magnetic member 43.

The electron source 20 is an exemplary particle source configured to emit a charged particle beam. The electron source 20 utilizes electric field or heat to emit electrons, applies predetermined electric field to the emitted electrons to accelerate the electrons toward the sample 10 or in the -Z-direction in FIG. 1, and outputs the accelerated electrons as an electron beam EB. The electron source 20 may apply a predetermined acceleration voltage (for example, 50 KV) to output the electron beam EB. The electron source 20 may be positioned on a perpendicular that is parallel to the Z-axis and extends from the surface of the sample 10, which is parallel to the XY-plane. The electron source 20 is installed within the vacuum vessel 22.

The electron beam lens apparatus 30 is arranged between the electron source 20 and the sample 10 and configured to cause the electron beam EB emitted from the electron source 20 to converge and to apply the converged electron beam EB onto the surface of the sample 10. The lens unit 40 and the supporting unit 50 are, for example, axisymmetrically structured around the axis along which the electron beam EB travels.

The lens unit 40 is positioned around a through hole through which the electron beam travels and is configured to converge or diffuse the electron beam. In the lens unit 40, the barrier 41 is positioned closer to the axis along which the electron beam EB travels. The barrier 41 is shaped, for example, like a cylinder extending in the Z-axis direction and forms the through hole through which the electron beam EB travels. The barrier 41 may be in contact with the vacuum vessel 22 at one of the ends thereof, in which the electron source 20 is installed, and with a vacuum vessel 112 at the other end thereof, in which the stage 110 is installed.

The contact surfaces of the barrier 41 that are in contact with the vacuum vessels 22 and 112 may provide vacuum sealing surfaces to keep the internal space within the vacuum vessel 22, the internal space within the cylindrical barrier 41 and the internal space within the vacuum vessel 112 vacuum. As shown in FIG. 1, the electron beam EB emitted from the electron source 20 travels through the space within the barrier 41 that is kept vacuum and then arrives at the sample 10.

The excitation unit 42 generates magnetic field in the direction in which the through hole extends, within the through hole that is kept vacuum by the barrier 41. The magnetic member 43 adjusts the strength and direction of the magnetic field generated by the excitation unit 42. In the above-described manner, the excitation unit 42 and the magnetic member 43 together form an electron beam lens that is capable of generating magnetic field in the lens axis direction on the lens axis around which the lens unit 40 has symmetry and converging the electron beam EB.

FIG. 1 illustrates a case where a single lens unit 40 is provided between the electron source 20 and the sample 10. The present embodiment, however, is not limited to such and a plurality of lens units 40 may be provided. FIG. 1 illustrates a single lens that is capable of converging the electron beam EB. The present embodiment, however, is not limited to such. A plurality of lens units 40 may be provided in combination to converge or diffuse the electron beam EB. In this case, the relation between the lens characteristics of the electron beam lens and the heat generation described with respect to FIGS. 11A, 11B, 11C and 12 applies to the electron beam lens that is the closest to the sample10 (the objective lens), for example.

The supporting unit 50 surrounds the lens unit 40 and structurally supports the lens unit 40. The supporting unit 50 and the vacuum vessel 22 in which the electron source 20 is installed fit together, which defines the magnitude of the misalignment between the beam trajectory of the electron beam EB emitted from the electron source 20 and the lens axis around which the lens unit 40 centers. The supporting unit 50 holds the electron source 20 and the lens unit 40 axially aligned with each other in such a manner that the magnitude of the misalignment between the lens axis of the electron beam lens and the beam trajectory can fall within such a range that an alignment unit (not shown) can electromagnetically align the electron beam EB along the axis.

The exposure controller 140 is connected to the stage 110 and the column 120 and configured to control the stage 110 and the column 120 during the exposure of the sample 10 to electron beams. The exposure controller 140 is configured to, for example, move the stage 110 in such a manner that a portion of the sample 10 to be exposed to electron beams coincides with the application position of the electron beam of the column 120 and allow the column 120 to apply the electron beam to the application position.

Figure 2A:
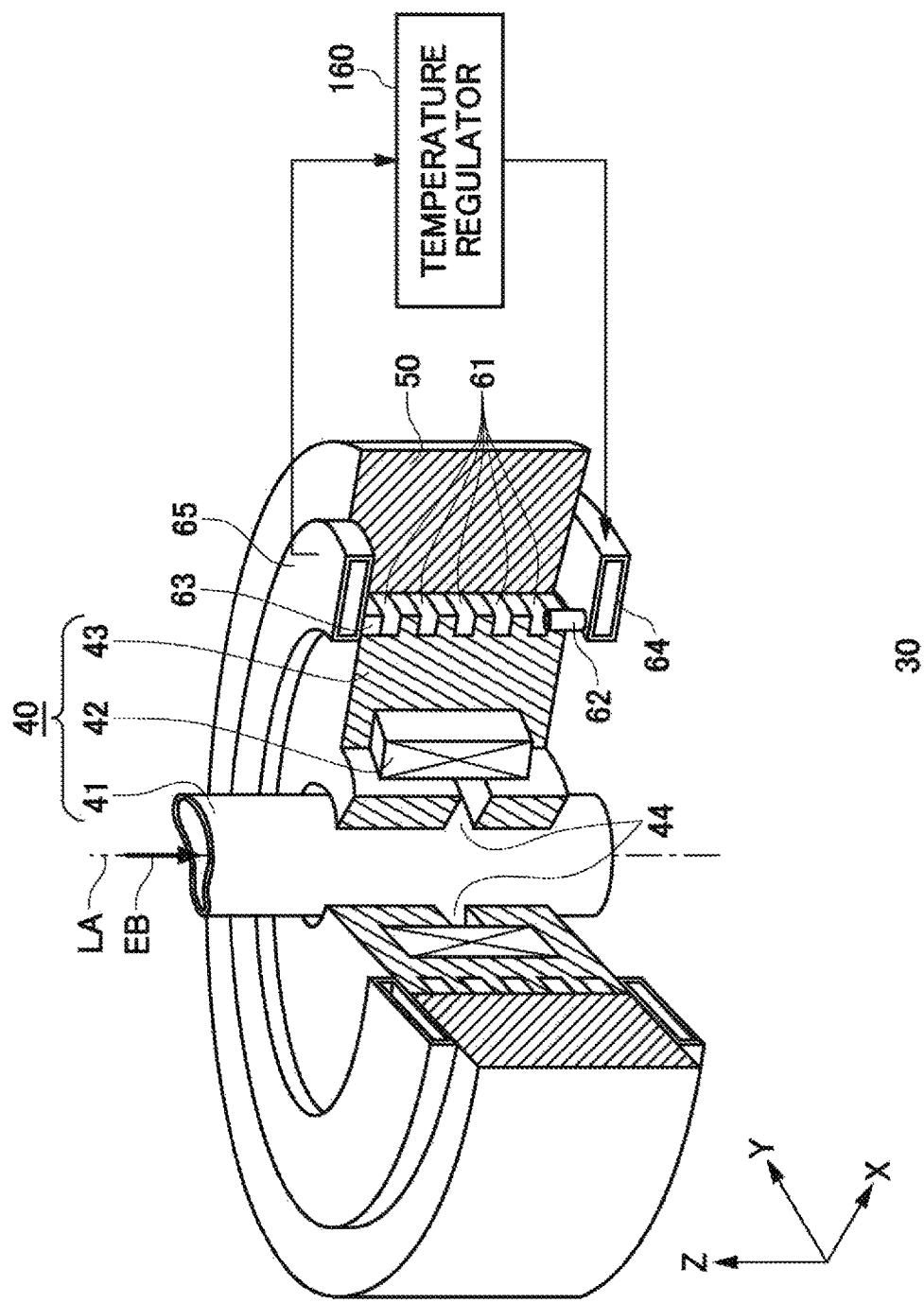
FIG. 2A is a perspective view showing an exemplary structure of an electron beam lens apparatus 30 relating to an embodiment of the present invention.
Figure 2B:
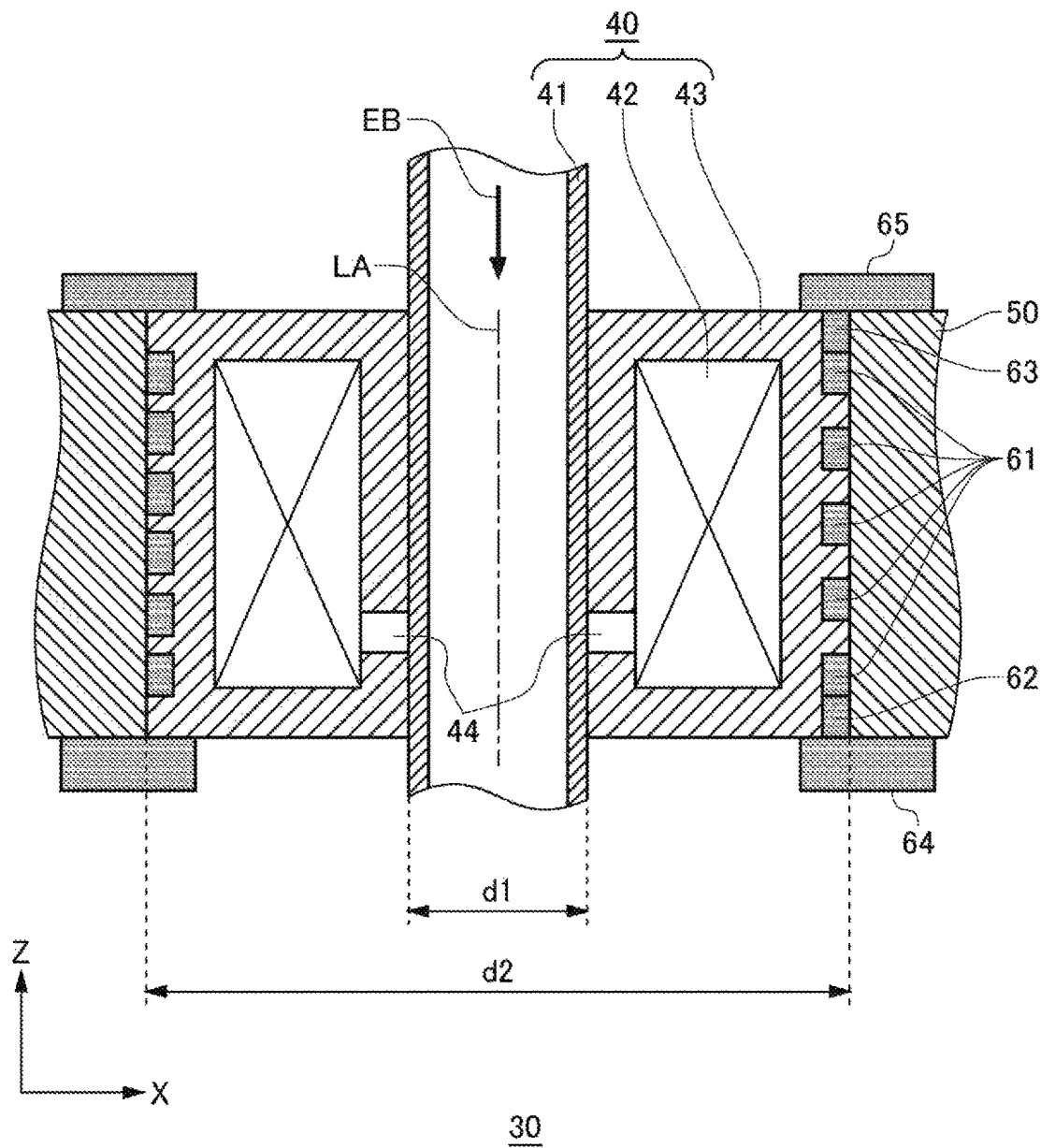
FIG. 2B is a cross-sectional view showing an exemplary structure of the electron beam lens apparatus 30 relating to the embodiment of the present invention.

The following further describes the exemplary structure of the electron beam lens apparatus 30. FIG. 2A is a perspective view showing the exemplary structure of the electron beam lens apparatus 30 relating to the embodiment of the present invention. FIG. 2B is a cross-sectional view showing the exemplary structure of the electron beam lens apparatus 30 relating to the embodiment of the present invention. The cross-sectional view shown in FIG. 2B is obtained by cutting the electron beam lens apparatus 30 shown in FIG. 2A along the plane that includes the lens axis LA and is parallel to the XZ-plane. In the following, when the exemplary structure of the electron beam lens apparatus 30 is mentioned, the perspective view in FIG. 2A and the cross-sectional view in FIG. 2B are not distinguished from each other and instead collectively referred to as FIG. 2. FIG. 2 illustrates an example where the lens unit 40 of the electron beam lens apparatus 30 includes a groove 61, an inlet 62, and an outlet 63. According to this example, the electron beam lens apparatus 30 further includes an inlet-side fluid tank 64, an outlet-side fluid tank 65 and a temperature regulator 160.

The central axis of the through hole indicated by the dot-and-dash line in FIG. 2 is equivalent to the lens axis LA. The electron beam EB travels through the through hole along the lens axis LA. The barrier 41 is shaped like a cylinder that centers around the lens axis LA. The barrier 41 is designed to separate the inner portion of the cylinder that is kept vacuum and through which the electron beam EB travels, that is to say, the through hole portion from the air that is external to the cylinder.

The excitation unit 42 is, for example, a coil designed to generate magnetic field by currents flowing around the lens axis LA. The excitation unit 42 may be a permanent magnet that can continue to generate magnetic field for a long period of time. Alternatively, the excitation unit 42 may be a combination of a coil and a permanent magnet, where the magnetic field generated by the permanent magnet is regulated by the magnetic field generated by the coil.

The magnetic member 43 centers around the lens axis LA and includes a cylindrical portion that is outside of the barrier 41 and inside of the excitation unit 42, a cylindrical portion that is outside of the excitation unit 42 and inside of the supporting unit 50, and portions that connect these cylindrical portions to each other at the +Z-side end of the excitation unit 42 and the −Z-side end of the excitation unit 42.

In other words, the magnetic member 43 is formed to surround the excitation unit 42. The magnetic member 43 may be made of a magnetic material that has high magnetic permeability and high saturated magnetic flux density, such as iron, alloy of iron and nickel or alloy of iron and cobalt. The magnetic member 43 has an inner diameter having a width d1 at a position close to the lens axis LA and an outer diameter having a width d2 at a position distant from the lens axis LA (see FIG. 2B).

The magnetic member 43 has a gap 44 at a position close to the lens axis LA. The gap 44 is a void that is formed in the magnetic member 43 and axisymmetrical around the lens axis LA. When the excitation unit 42 is excited, the ends of the magnetic member 43 that face each other with the gap 44 therebetween become the north pole and the south pole, which generates local magnetic field in the vicinity of the gap 44. This local magnetic field is symmetrically distributed around the lens axis LA.

Stated differently, on the lens axis LA, the magnetic field generated by the lens unit 40 is directed in the extending direction of the lens axis LA. The strength of the magnetic field on the lens axis LA takes a maximal value in the vicinity of the gap 44 and dramatically drops as moving away from the gap 44 in the Z-axis direction. The local magnetic field having such a distribution acts as a convex lens on the electron beam EB traveling along the lens axis LA.

The supporting unit 50 surrounds, aligns and supports the lens unit 40. Part of the outer peripheral portion of the lens unit 40 is in contact with the supporting unit 50, and part of the inner peripheral portion of the supporting unit 50 is in contact with the lens unit 40.

To circulate a coolant fluid along the outer periphery of the lens unit 40, the groove 61 is formed in at least one of the outer peripheral portion of the lens unit 40 that is in contact with the supporting unit 50 and the inner peripheral portion of the supporting unit 50 that is in contact with the lens unit 40. FIG. 2 shows an example where a spiral groove 61 is formed in the outer peripheral portion of the lens unit 40 that is in contact with the supporting unit 50, in order to circulate a coolant fluid along the outer periphery of the lens unit 40.

The outer peripheral portion of the lens unit 40 in which the groove 61 is formed may be parallel to the direction of the lens axis LA, which coincides with the extending direction of the through hole, and may be entirely at substantially equal distances from the central axis of the through hole. The groove 61 is spirally formed as if the groove 61 is wound around the outer periphery of the lens unit 40, and may be axisymmetrical around the central axis of the through hole. Since the groove 61, which is formed in the outer peripheral portion of the lens unit 40, is covered with the inner peripheral portion of the supporting unit 50 as if a lid is put on, the combination of the groove 61 and the supporting unit 50 forms a flow channel through which a coolant fluid flows.

In the above-described manner, the electron beam lens apparatus 30 can be provided with, as the heat eliminating unit, the flow channel through which a coolant fluid flows, without adding new components to the lens unit 40 and the supporting unit 50. Since no new components are added, the inner diameter d1 and outer diameter d2 of the lens unit 40 can remain substantially the same as when the electron beam lens includes no heat eliminating unit. Stated differently, even if the outer diameter d2 of the lens unit 40 is limited to be, for example, 30 mm or less, the electron beam lens apparatus 30 can have a flow channel through which a coolant fluid flows.

The inlet 62 is connected to one end of the groove 61. Also, the outlet 63 is connected to the other end of the groove 61. The groove 61 receives a coolant fluid through the inlet 62 and discharges the coolant fluid through the outlet 63. The inlet 62 may be positioned on the electron beam EB exit side in the electron beam lens apparatus 30. The outlet 63 may be positioned on the electron beam EB entrance side in the electron beam lens apparatus 30.

The inlet-side fluid tank 64 is connected to the inlet 62 and feeds the coolant fluid to the inlet 62. The outlet-side fluid tank 65 is connected to the outlet 63, receives through the outlet 63 the coolant fluid that has traveled through the groove 61 and discharges the coolant fluid. The temperature regulator 160 regulates the temperature of the coolant fluid. The temperature regulator 160 is provided outside the electron beam lens apparatus 30 and may be connected to the inlet-side fluid tank 64 and the outlet-side fluid tank 65. The temperature regulator 160 may cause the coolant fluid to circulate from the inlet-side fluid tank 64 to the outlet-side fluid tank 65.

For example, the temperature regulator 160 delivers the coolant fluid into the groove 61 after traveling through the inlet-side fluid tank 64 and the inlet 62. The temperature of the coolant fluid rises as the coolant fluid travels through the groove 61 and thus thermally comes into contact with the lens unit 40. Such heated coolant fluid flows back to the temperature regulator 160 after traveling through the outlet 63 and the outlet-side fluid tank 65. The temperature regulator 160 cools such heated coolant fluid to regulate the temperature.

The temperature regulator 160 feeds the temperature-regulated coolant fluid. The temperature-regulated coolant fluid flows into the beam-exit-side portion of the groove 61 through the inlet 62, which is positioned on the beam exit side, and cools the beam-exit-side portion of the lens unit 40. When the electron beam lens is used as an objective lens, the temperature-regulated coolant fluid can more swiftly control the temperature of the exit-side lens component that faces the sample 10 than the temperature of the entrance-side lens component. In the above-described manner, the electron beam lens apparatus 30 can reduce the heat radiation from the lens unit 40 to the sample 10 and thus the thermal expansion of the sample 10.

The following describes modification examples of the electron beam lens apparatus 30. The electron beam lens apparatus 30 includes the lens unit 40 that is positioned around a through hole through which the electron beam travels and configured to converge or diffuse the electron beam and the supporting unit 50 that surrounds the lens unit 40. According to the modification examples of the present embodiment, the lens unit 40 includes a heat eliminating unit to eliminate the heat generated by the electron beam lens, in addition to the barrier 41, the excitation unit 42 and the magnetic member 43.

Figure 3:
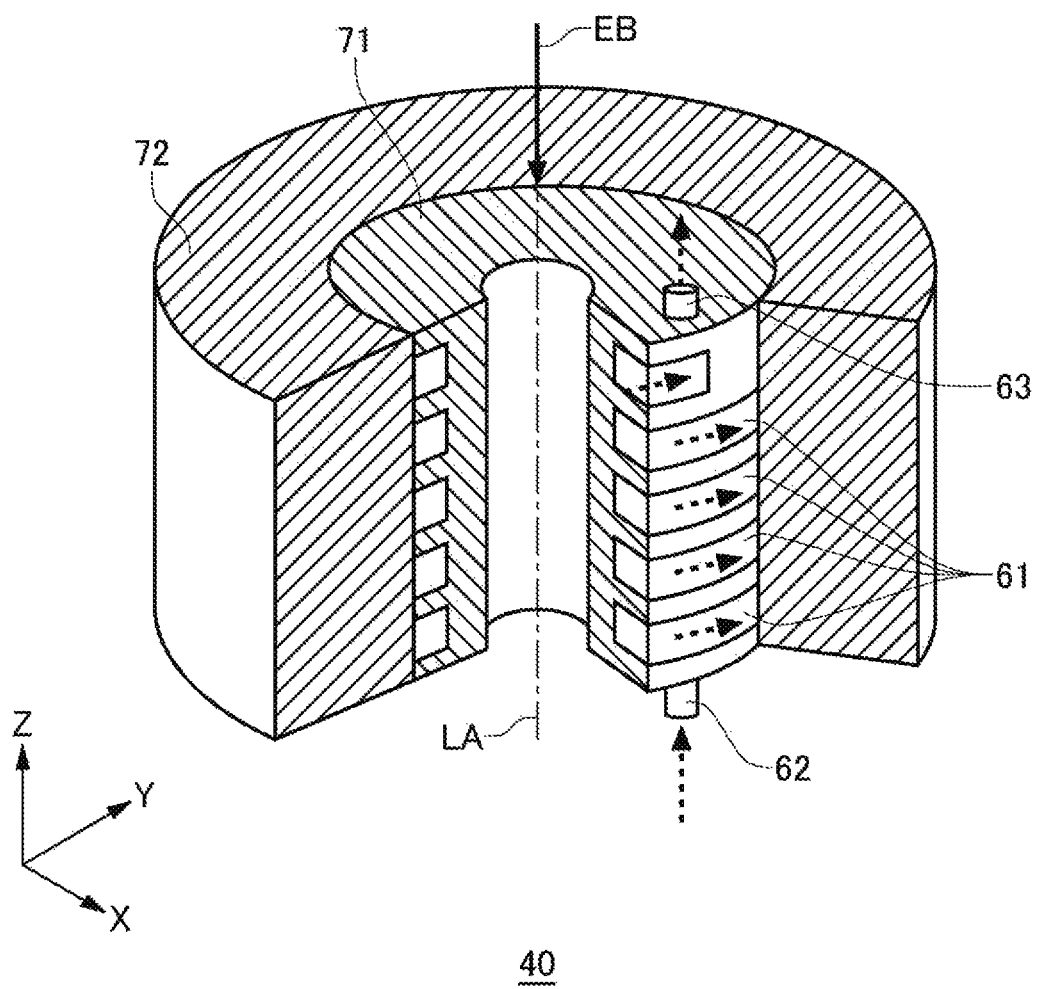
FIG. 3 is a perspective view showing a first modification example of a lens unit 40 relating to an embodiment of the present invention.
Figure 4:
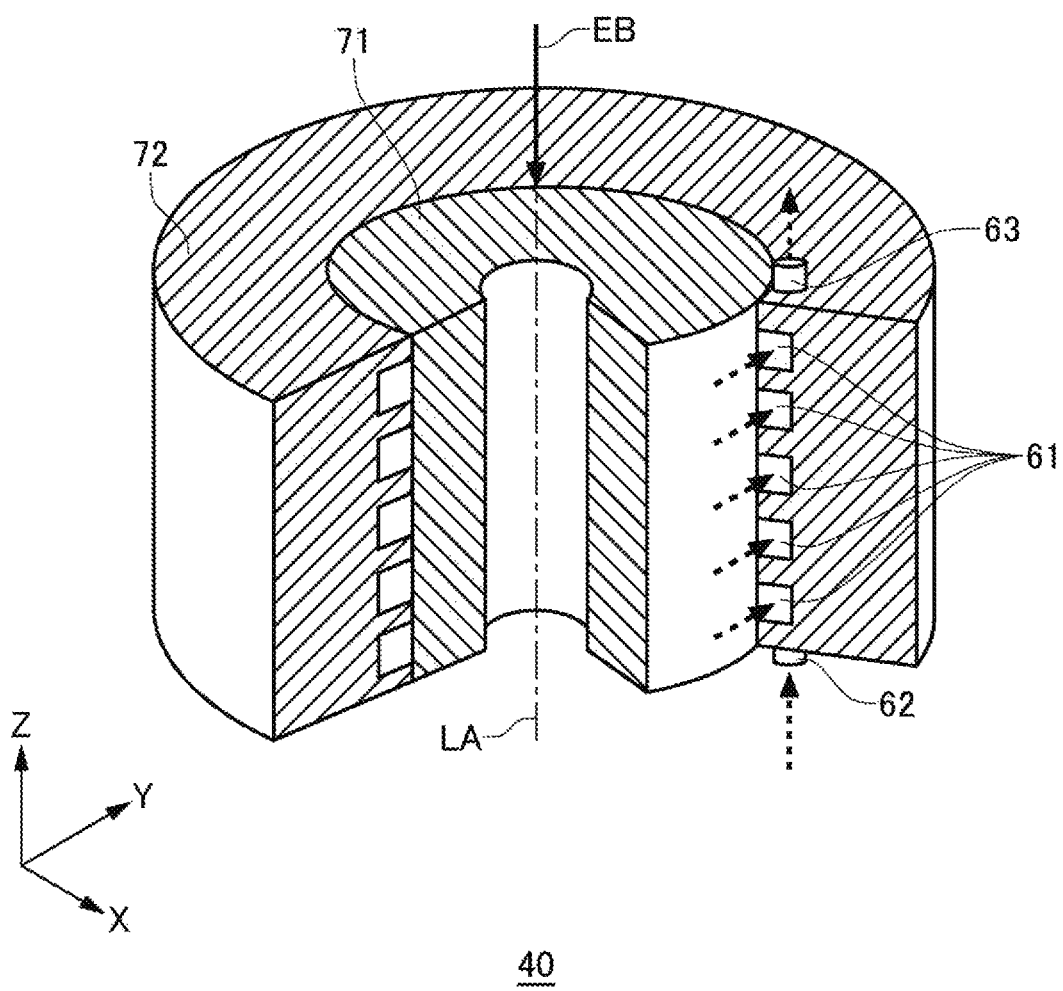
FIG. 4 is a perspective view showing a second modification example of the lens unit 40 relating to the embodiment of the present invention.
Figure 5:
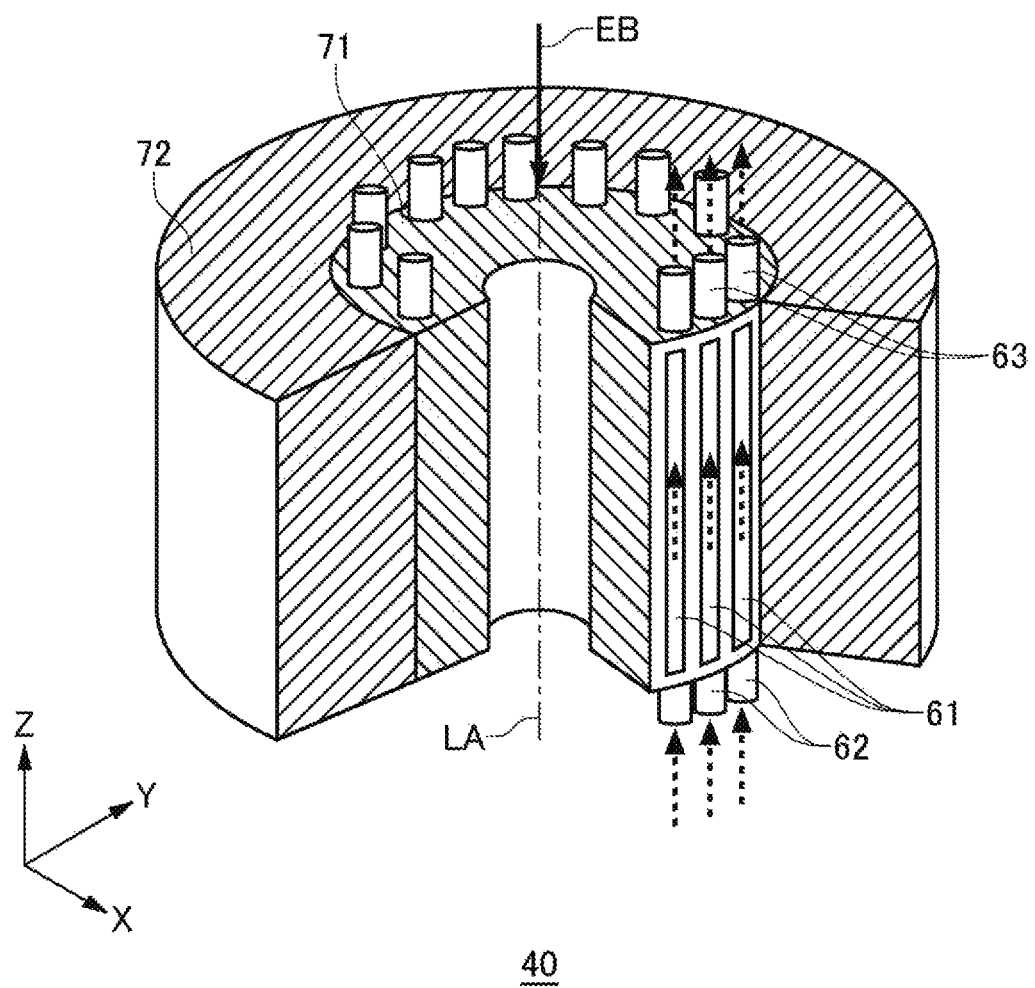
FIG. 5 is a perspective view showing a third modification example of the lens unit 40 relating to the embodiment of the present invention.
Figure 6:
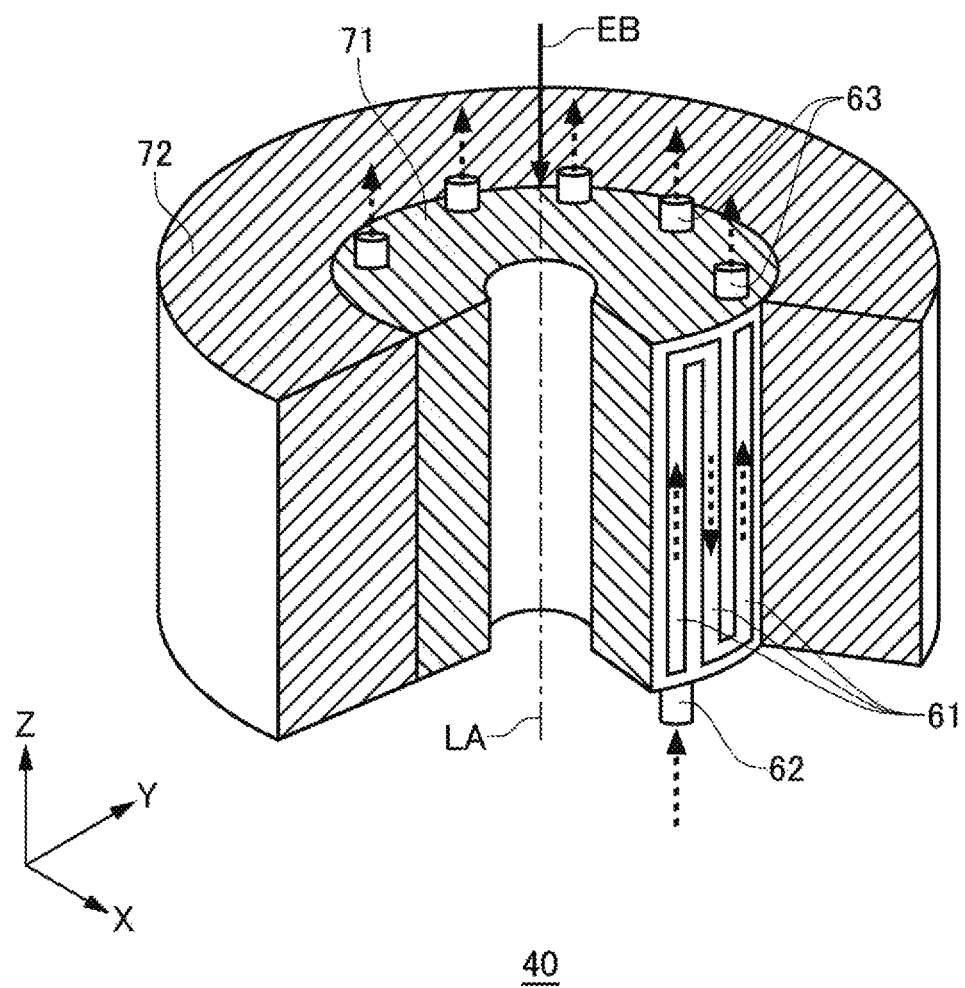
FIG. 6 is a perspective view showing a fourth modification example of the lens unit 40 relating to the embodiment of the present invention.

FIG. 3 is a perspective view showing a first modification example of the lens unit 40 relating to the present embodiment. FIG. 4 is a perspective view showing a second modification example of the lens unit 40 relating to the present embodiment. FIG. 5 is a perspective view showing a third modification example of the lens unit 40 relating to the present embodiment. FIG. 6 is a perspective view showing a fourth modification example of the lens unit 40 relating to the present embodiment. In FIGS. 3 to 6, the components that have substantially the same functions as the components shown in FIG. 2 are assigned with the same reference numerals and not described here. In FIGS. 3 to 6, the lens unit 40 includes a first member 71 that is positioned around a through hole centering around the lens axis LA and a second member that surrounds the first member 71.

According to the modification examples of the lens unit 40 shown in FIGS. 3 to 6, the groove 61 is formed to provide the coolant fluid flowing along the outer periphery of the first member 71, in at least one of the outer peripheral portion of the first member 71 that is in contact with the second member 72 and the inner peripheral portion of the second member 72 that is in contact with the first member 71. The outer peripheral portion of the first member 71 and the inner peripheral portion of the second member 72 may be at least part of the plane parallel to the extending direction of the through hole. The groove 61 may be symmetrically formed with respect to the plane that passes through the central axis of the through hole.

According to the first modification example of the lens unit 40 shown in FIG. 3, a spiral groove 61 through which the coolant fluid flows along the outer periphery of the first member 71 is formed in the outer peripheral portion of the first member 71 that is in contact with the second member 72. The dotted arrow in FIG. 3 represents the flow direction of the coolant fluid. The coolant fluid enters into the groove 61 through the inlet 62, which is positioned on the electron beam EB exit side of the lens unit 40, and flows through the spiral groove 61 from the electron beam EB exit side to the electron beam EB entrance side. The coolant fluid receives the heat from the lens unit 40 as it travels through the spiral groove 61. Thus, the temperature of the coolant fluid rises. The coolant fluid is discharged through the outlet 63, which is positioned on the electron beam EB entrance side.

Here, the coolant fluid may flow into the inlet 62 from the inlet-side fluid tank 64, which is positioned on the electron beam EB exit side of the lens unit 40, and flow out of the outlet 63 to the outlet-side fluid tank 65, which is positioned on the electron beam EB entrance side of the lens unit 40. The coolant fluid then arrives at the temperature regulator 160, which is positioned outside the lens unit 40, to eliminate the heat received from the lens unit 40. The inlet-side fluid tank 64, the outlet-side fluid tank 65 and the temperature regulator 160 have already been described with reference to FIG. 2A and are thus not illustrated in FIG. 3.

FIG. 3 shows an example where the first member 71 has a single continuous spiral groove 61 through which the coolant fluid flows. The first member 71, however, may alternatively include a plurality of spiral grooves 61. If this is the case, the lens unit 40 may include a plurality of inlets 62 and a plurality of outlets 63 in correspondence with the plurality of spiral grooves 61.

According to the second modification example of the lens unit 40 shown in FIG. 4, a spiral groove 61 through which the coolant fluid flows along the inner periphery of the second member 72 is formed in the inner peripheral portion of the second member 72 that is in contact with the first member 71. The dotted arrow in FIG. 4 represents the flow direction of the coolant fluid. The coolant fluid enters into the groove through the inlet 62, which is positioned on the electron beam EB exit side of the lens unit 40, and flows through the spiral groove 61 from the electron beam EB exit side to the electron beam EB entrance side. The coolant fluid receives the heat from the lens unit 40 as it travels through the spiral groove 61. Thus, the temperature of the coolant fluid rises. The coolant fluid is discharged through the outlet 63, which is positioned on the electron beam EB entrance side. As is with the example described with reference to FIG. 3, the coolant fluid arrives at the temperature regulator 160, which is positioned outside the lens unit 40, to eliminate the heat received from the lens unit 40. In addition, the second member 72 may likewise include a plurality of spiral grooves 61 in the example shown in FIG. 4.

In the exemplary lens units 40 shown in FIGS. 3 and 4, a single or plurality of continuous spiral grooves 61 are formed in the outer peripheral portion of the first member 71 or the inner peripheral portion of the second member 72. The inlet 62 and outlet 63 may be respectively provided at the corresponding ends of one continuous spiral groove 61. In this case, the lens unit 40 includes a single or plurality of pairs of the inlet 62 and the outlet 63. Here, when the lens unit 40 is provided with a small number of, for example, less than five pairs of the inlet 62 and the outlet 63, the inlets 62 and outlets 63 may be directly connected to the temperature regulator 160 without the inlet-side fluid tank 64 and the outlet-side fluid tank 65 placed therebetween.

According to the third modification example of the lens unit 40 shown in FIG. 5, a plurality of linear grooves 61 through which the coolant fluid flows along the outer periphery of the first member 71 are formed in the outer peripheral portion of the first member 71 that is in contact with the second member 72. The dotted arrow in FIG. 5 represents the flow direction of the coolant fluid. The coolant fluid enters in parallel through a plurality of inlets 62, which are positioned on the electron beam EB exit side of the lens unit 40, into the grooves 61 respectively corresponding to the inlets 62, flows through the grooves 61 from the electron beam EB exit side to the electron beam EB entrance side. The coolant fluid receives the heat from the lens unit 40 as it travels through the linear grooves 61. Thus, the temperature of the coolant fluid rises. The coolant fluid is discharged through a plurality of outlets 63, which are positioned on the electron beam EB entrance side. As is with the example described with reference to FIG. 3, the coolant fluid arrives at the temperature regulator 160, which is positioned outside the lens unit 40, to eliminate the heat received from the lens unit 40.

According to the fourth modification example of the lens unit 40 shown in FIG. 6, a plurality of linear grooves 61 having folded paths through which the coolant fluid flows along the outer periphery of the first member 71 are formed in the outer peripheral portion of the first member 71 that is in contact with the second member 72. The dotted arrow in FIG. 6 represents the flow direction of the coolant fluid. The coolant fluid enters in parallel through a plurality of inlets 62, which are positioned on the electron beam EB exit side of the lens unit 40, into the grooves 61 respectively corresponding to the inlets 62, and flows through the grooves 61 from the electron beam EB exit side to the electron beam EB entrance side. The coolant fluid receives the heat from the lens unit 40 as it travels through the linear grooves 61 having folded paths. Thus, the temperature of the coolant fluid rises. The coolant fluid is discharged through a plurality of outlets 63, which are positioned on the electron beam EB entrance side. As is with the example described with reference to FIG. 3, the coolant fluid arrives at the temperature regulator 160, which is positioned outside the lens unit 40, to eliminate the heat received from the lens unit 40.

According to the examples shown in FIGS. 5 and 6, the lens unit 40 includes a plurality of grooves 61 and a plurality of pairs of the inlet 62 and outlet 63 in correspondence with the plurality of grooves 61. The inlets 62 may be connected to a single inlet-side fluid tank 64. The outlets 63 may be connected to a single outlet-side fluid tank 65. The inlet-side fluid tank 64 stores therein the coolant fluid delivered from the temperature regulator 160 and feeds the coolant fluid in parallel to the plurality of inlets 62. The outlet-side fluid tank 65 stores therein the coolant fluid discharged in parallel from the plurality of outlets 63 and feeds the coolant fluid back to the temperature regulator 160.

In the modification examples of the lens unit 40 shown in FIGS. 3, 4, 5 and 6, the first member 71 is positioned around a through hole that penetrates through the lens unit 40, and the second member 72 surrounds the first member 71. The first member 71 and the second member 72 constitute at least one of the barrier 41, the excitation unit 42 and the magnetic member 43, which together constitute the lens unit 40.

For example, the first member 71 may form part of the barrier 41, and the second member 72 forms part or all of the magnetic member 43. Alternatively, the first member 71 may form part or all of the magnetic member 43. In this case, the second member 72 may form part or all of the excitation unit 42. Alternatively, the first member 71 may form part or all of the excitation unit 42. In this case, the second member 72 may form part or all of the magnetic member 43.

Alternatively, at least one of the barrier 41, the excitation unit 42 and the magnetic member 43 is divided into pieces, one of which may be treated as the first member 71 and the other of which as the second member 72. In this case, the pieces are an inner cylindrical portion close to the lens axis LA and an outer cylindrical portion distant from the lens axis LA, which respectively correspond to the first member 71 and the second member 72.

According to the modification examples of the lens unit 40 shown in FIGS. 3, 4, 5 and 6, the groove 61 is formed in at least one of the outer peripheral portion of the first member 71 that is in contact with the second member 72 and the inner peripheral portion of the second member 72 that is in contact with the first member 71 and covered with the other as if a lid is put on. The combination of the groove 61 and one of the outer peripheral portion of the first member 71 and the inner peripheral portion of the second member 72 that covers the groove 61 forms the flow channel through which the coolant fluid flows.

In the above-described manner, the electron beam lens apparatus 30 can be provided with a flow channel through which a coolant fluid flows in order to eliminate the heat generated by the lens unit 40, without adding new components to the lens unit 40. Since no new components are added to the electron beam lens apparatus 30 as described above, the inner diameter d1 and outer diameter d2 of the lens unit 40 can remain substantially the same as when no flow channel is provided to feed a coolant fluid. In other words, when an electron beam lens is designed to include a lens unit 40 having an outer diameter d2 within substantially 30 mm, for example, a flow channel through which a coolant fluid flows can be added to the lens unit 40 without changing the size of the outer diameter d2.

Here, the heat eliminating unit of the electron beam lens apparatus 30 relating to the present embodiment is compared against the heat eliminating units of the electron beam lens shown in FIGS. 11A, 11B and 11C. The heat eliminating unit relating to the present embodiment is more capable of eliminating heat than the heat eliminating unit shown in FIG. 11A, if the coolant fluid flows at the same flow rate. While the coolant fluid is in indirect contact with the lens component with the tube 81 placed therebetween according to the technique shown in FIG. 11A, the coolant fluid flows through the groove 61 formed in the component of the electron beam lens apparatus 30 according to the heat eliminating technique relating to the present embodiment and is thus in direct contact with the component of the electron beam lens apparatus 30.

The heat eliminating capability was investigated for a case where the tube 81 shown in FIG. 11A is provided on the outer periphery of the magnetic member 43 and a case where the groove 61 relating to the present embodiment is provided in the outer peripheral portion of the magnetic member 43 under such a condition that the lens unit 40 has substantially the same shape for each case. The heat generated by the lens unit 40 was set to 100 W, and the coolant fluid was controlled to flow at the same flow rate to eliminate the heat. Under such conditions, the temperature of a predetermined site of the electron beam lens apparatus 30 was measured for each case and the results were compared. While the technique shown in FIG. 11A caused the temperature at the predetermined site of the electron beam lens apparatus 30 to rise and reach 70° C. or higher, the heat eliminating unit relating to the present embodiment could keep the temperature at the same site to be equal to or lower than 50° C.

The heat eliminating unit of the electron beam lens apparatus 30 relating to the present embodiment is compared against the heat eliminating unit shown in FIG. 11B. According to the technique shown in FIG. 11B, the coolant fluid flows through the linear through hole 82 penetrating through the magnetic member 43. According to the present embodiment, the coolant fluid flows through the groove 61 formed, for example, in the outer peripheral portion of the magnetic member 43. The groove 61 can be shaped in various ways in both the longitudinal direction of the groove 61 (the direction in which the coolant fluid flows) and the cross-sectional direction of the groove 61 (the direction orthogonal to the direction in which the coolant fluid flows).

When compared with the linear through hole 82 shown in FIG. 11B, the heat eliminating unit relating to the present embodiment can achieve an increased contact area between the coolant fluid and the lens component due to the circulation of the coolant fluid through the groove 61. Consequently, the heat eliminating unit relating to the present embodiment can be highly capable of eliminating the heat when compared with the technique shown in FIG. 11B.

The heat eliminating unit of the electron beam lens apparatus 30 relating to the present embodiment is compared against the heat eliminating unit shown in FIG. 11C. The excitation unit 42 shown in FIG. 11C is immersed in the coolant fluid enclosed within the container 83. On the other hand, the excitation unit 42 relating to the present embodiment can be completely isolated from the coolant fluid. In the present embodiment, the coolant fluid is not in direct contact with the excitation unit 42 while circulating through the lens. If the heat eliminating unit relating to the present embodiment is employed, currents can be stably fed to the excitation unit 42 while the coolant fluid is allowed to circulate. This means that the electron beam lens apparatus 30 relating to the present embodiment can include therein a flow channel through which a coolant fluid flows without requiring changes in outer diameter size and the like and thus achieve improved heat eliminating capability.

The following describes how to manufacture the groove 61 relating to the present embodiment. The groove 61 may be formed by processing in advance the surface of the inner or outer peripheral portion of a lens component before the electron beam lens apparatus 30 is assembled. For example, the groove 61 is provided by cutting the surface of the component. In this case, the groove 61 may be provided by moving a cutting tool relatively to the component to cut the surface in such a manner that the groove 61 has a predetermined shape when seen in the longitudinal direction (the direction of the coolant fluid flow) and in the cross-sectional direction (the direction orthogonal to the direction of the coolant fluid flow).

Alternatively, the groove 61 may be formed concurrently with a component of the electron beam lens apparatus 30. For example, when the component is manufactured by stacking materials by using a 3D printer or the like, the groove 61 can be formed by not stacking the materials at the corresponding site. In this manner, the component can have the predetermined groove 61.

The following describes the circulation of the coolant fluid relating to the present embodiment. The coolant fluid may be cooling water containing a small amount of antirust components. The following description is made under an assumption that cooling water principally containing water is used as the coolant fluid flowing through the spiral groove 61 shown in FIG. 2.

The following examines the requirements to allow the cooling water to have laminar flow when U denotes the flow rate of the cooling water and D denotes the tubular diameter of the cooling water flow channel formed by the groove 61. The requirements to allow the cooling water to have laminar flow can be considered to be the same as the requirements to prevent the cooling water flow from causing the electron beam lens to vibrate. Here, the tubular diameter D of the cooling water flow channel is defined as the diameter of a circular tube that has the same cross-sectional area of the cooling water flow channel.

The flow velocity V of the cooling water is calculated according to the following equation 1 based on the values of the flow rate U of the cooling water and the tubular diameter D. Here, the density $\rho$ and viscosity $\mu$ of the cooling water are respectively 1 g/cm$^3$ and 1 mPa·s (millipascal·seconds). In this case, the Reynolds number Re of the cooling water flowing through the cooling water flow channel of the groove 61 is calculated according to the following equation 2.

$$V = 4 \times U/(\pi D^2) \qquad \text{Equation 1}$$

$$Re = V \times D /(\mu/\rho) \qquad \text{Equation 2}$$

If the Reynolds number Re is, for example, 2000 or less, the cooling water has laminar flow. Based on the requirements for the sizes of the lens components and the Reynolds number Re of 2000 or less, the relation between the flow rate U of the cooling water and the cross-sectional area of the groove 61 or the tubular diameter D is estimated.

When the groove 61 is formed in the outer peripheral portion of the lens unit 40, in order to allow cooling water to flow in laminar flow at a flow rate U of 1 mL/s to 2 mL/s (milliliters per second), the cross-sectional area of the groove 61 is preferably no less than 0.5 mm$^2$ and no more than 1 mm$^2$ and at least two parallel grooves 61 are preferably formed between the inlet 62 and the outlet 63. When the outer diameter of the lens unit 40 is set to be no less than 22 mm and no more than 30 mm, the possible length L of the groove 61 is no less than 0.7 m and no more than 1.5 m taking into the consideration the size of the outer peripheral portion of the lens unit 40 in which the groove 61 is to be formed.

Figure 7:
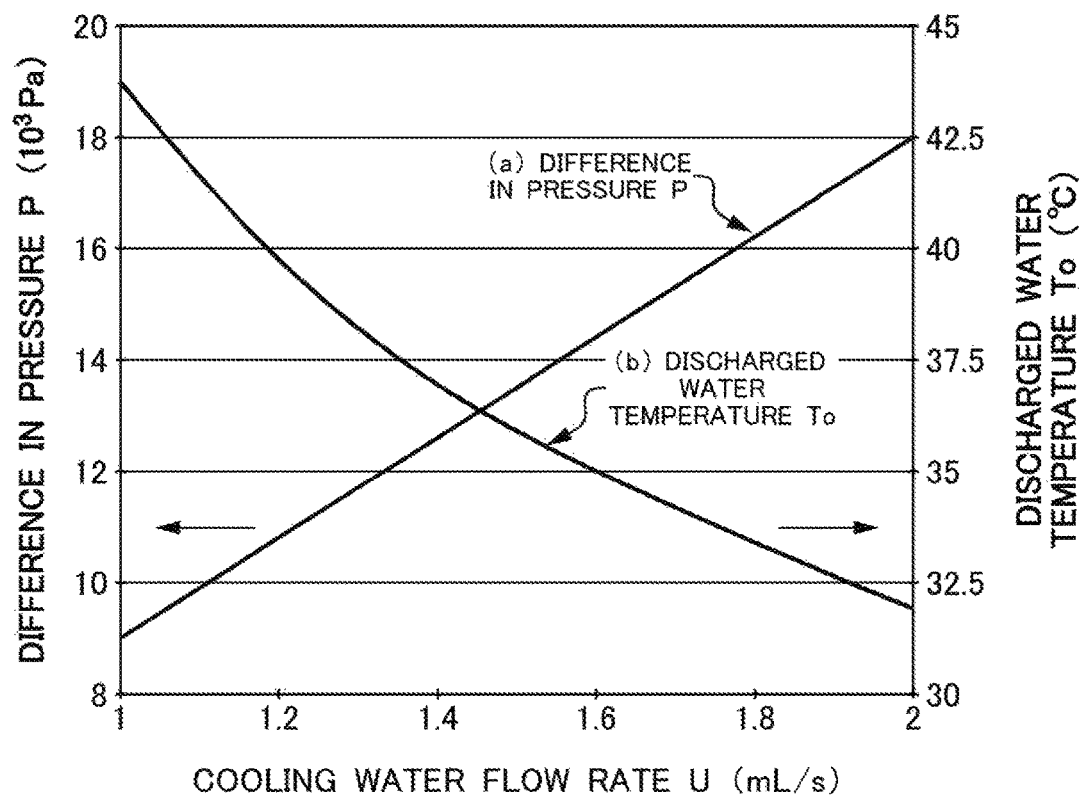
FIG. 7 shows a graph illustrating how the flow rate of cooling water is related to the difference in pressure between the respective ends of a groove 61 and to a discharged water temperature.

FIG. 7 shows exemplary results obtained by simulating how the flow rate U of the cooling water is related to the difference in pressure P between the ends of the groove 61 and the discharged water temperature To for the cooling water flow channel formed by the above-described groove 61. In FIG. 7, the horizontal axis represents the sum of the flow rates U of the cooling water flowing through the two parallel grooves 61. The sum of the flow rates U of the cooling water falls within the range of 1 mL/s to 2 mL/s.

The graph (a) represents the difference in pressure P of the cooling water between the inlet 62 and the outlet 63. The left vertical axis in FIG. 7 represents the difference in pressure plotted in the graph (a). The graph (b) represents the temperature To of the cooling water discharged through the outlet 63. The cooling water flows into the groove 61 after the temperature of the cooling water is regulated to 20° C. by traveling through the temperature regulator 160. The right vertical axis in FIG. 7 represents the temperature of the discharged water plotted in the graph (b).

The difference in pressure P can be calculated according to the following equation 3 based on the friction coefficient λ for the cooling water flow. Here, the friction coefficient λ for the cooling water flow is calculated according to the equation 4 based on the Reynolds number Re. Also, the discharged water temperature To for the cooling water can be calculated under an assumption that the cooling water has a temperature of 20° C. when flowing through the inlet 62 and can entirely eliminate the heat of 100 W generated by the electron beam lens.

$$P = \lambda \times (L/d) \times (\tfrac{1}{2}) \times (\rho \times V^2) \quad \text{Equation 3}$$

$$\lambda = 64/Re \quad \text{Equation 4}$$

FIG. 7 reveals that, as an example, if cooling water flows through the groove 61 at a flow rate of 1.5 mL/s against the difference in pressure P of approximately $15 \times 10^3$ Pa between the ends of the cooling water flow channel formed by the groove 61, the heat of 100 W generated by the electron beam lens can be eliminated in such a manner that the discharged water temperature To can be 40° C. or lower. FIG. 7 reveals that the heat of 100 W or higher generated by the electron beam lens can be eliminated by setting the cooling water flow rate U and the difference in pressure P within the ranges shown in FIG. 7.

The cross-sectional area and depth of the groove 61 that can satisfy the requirements shown in FIG. 7 are respectively within a range of no less than 0.5 mm$^2$ and no more than 1 mm$^2$ and within a range of 1 mm or less. This means that the heat can be eliminated even when the width in the moving radius direction of the outer peripheral portion of the lens unit 40 in which the groove 61 is formed, in other words, the outer peripheral portion of the magnetic member 43 in FIG. 2, is, for example, 3 mm or less. Since such a groove 61 can be formed in the outer peripheral portion of the lens unit 40 relating to the present embodiment, the electron beam lens apparatus 30 can accommodate generation of heat of 100 W or higher.

Figure 8:
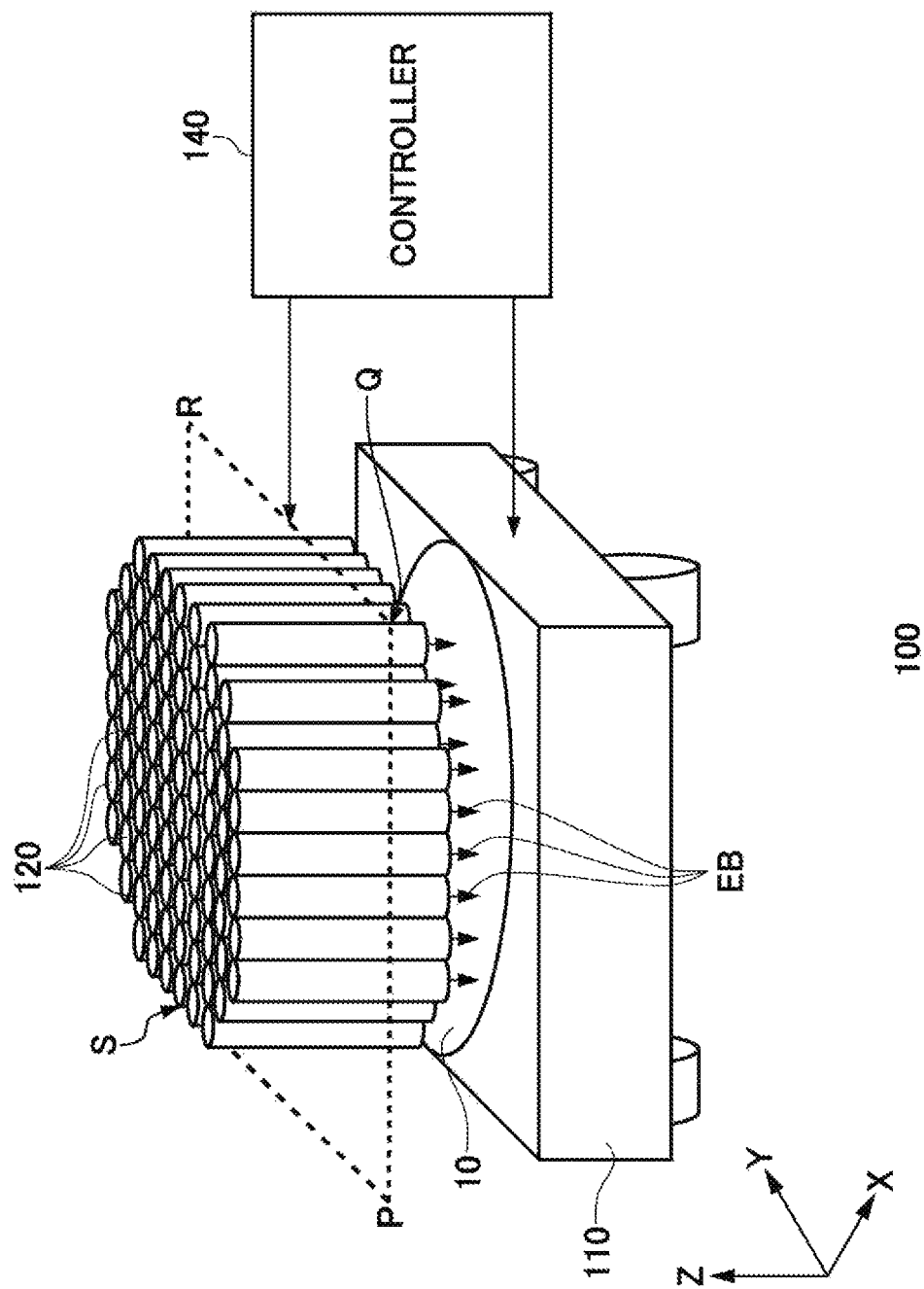
FIG. 8 shows a modification example of an electron beam exposure apparatus 100 relating to an embodiment of the present invention.

FIG. 8 shows a modification example of the electron beam exposure apparatus 100 relating to the embodiment of the present invention. The electron beam exposure apparatus 100 relating to the present modification example has components that have substantially the same functions as the corresponding components of the electron beam exposure apparatus 100 shown in FIG. 1. Such components are assigned with the same reference numerals and not described here. The modification example of the electron beam exposure apparatus 100 shown in FIG. 8 includes a single stage 110 that allows the sample 10 to be placed thereon and can move the sample 10 in the XY-plane direction, a plurality of cylindrical columns 120 that are arranged within the XY-plane and an exposure controller 140 that can control the stage 110 and the columns 120.

The columns 120 are each connected to the exposure controller 140 and each column 120 is configured to apply electron beams to a corresponding region of the sample 10 that can be moved by the stage 110. The plurality of columns 120 can apply electron beams in parallel, which can significantly improve the throughput of the exposure. In addition, even when the sample 10 is a semiconductor wafer having a large diameter of 300 mm or more or the like, the present modification example can prevent the throughput from significantly dropping by increasing the number of the columns 120 in accordance with the size of the semiconductor wafer.

According to the modification example of the electron beam exposure apparatus 100 shown in FIG. 8, the columns 120 are arranged at predetermined intervals in the X- and Y-directions. For example, the plurality of columns 120 are arranged at a pitch of 30 mm in both the X- and Y-directions. If such is the case, 88 columns 120 can be arranged above the sample 10 having a diameter of 300 mm. In addition, the lens unit 40 constituting each column 120 has an outer diameter d2 of 30 mm or less, in this case. Alternatively, for example, the columns 120 can be arranged at a pitch of 22 mm in both the X- and Y-directions. In this case, the lens unit 40 constituting each column 120 has an outer diameter d2 of 22 mm or less. In this way, 157 columns 120 can be arranged above the wafer of the sample 10 having a diameter of 300 mm.

Figure 9:
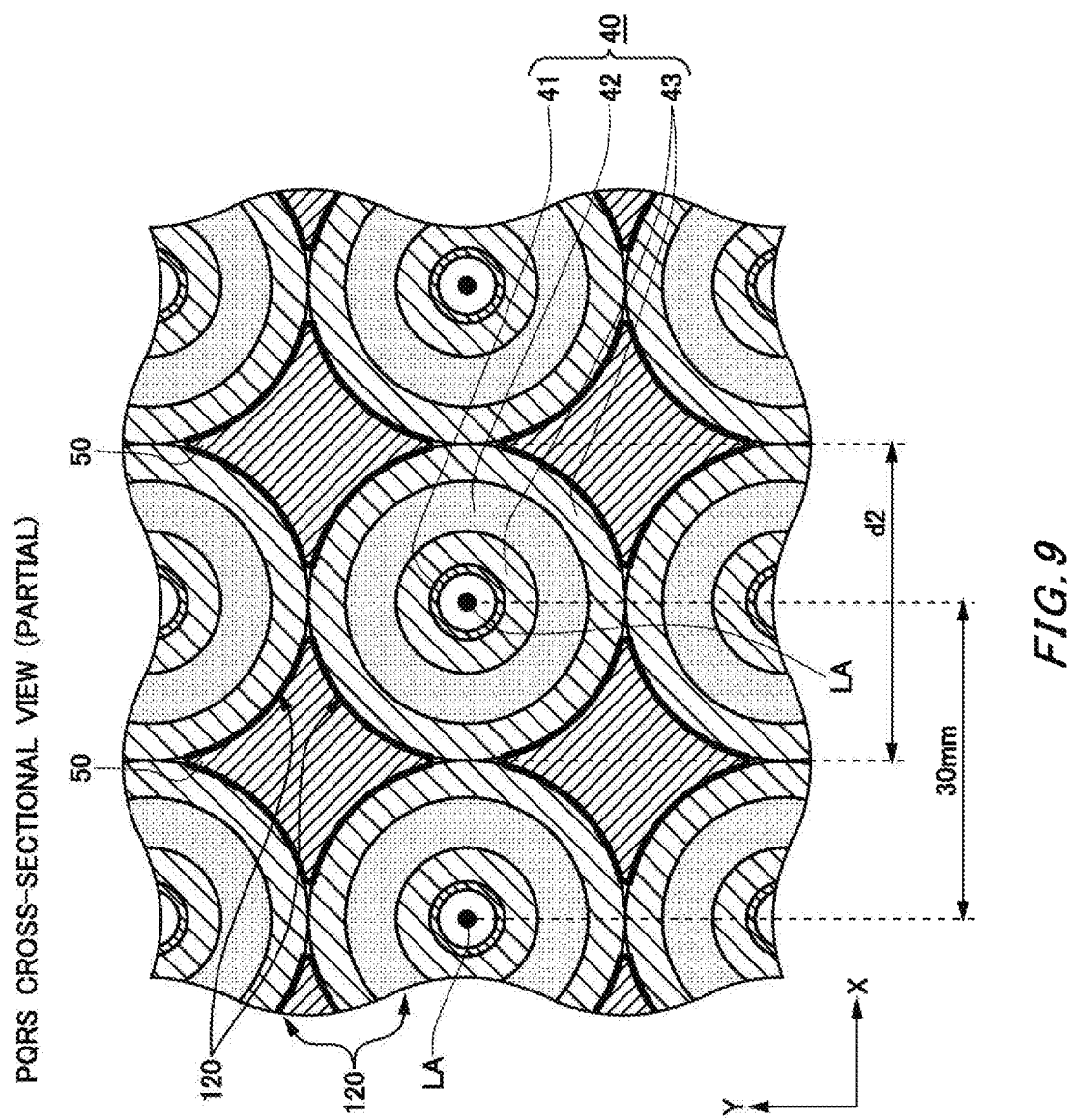
FIG. 9 is a cross-sectional view showing the structure of the lens unit 40 included in the modification example of the electron beam exposure apparatus 100.

FIG. 9 is a cross-sectional view showing the structure of the electron beam lenses corresponding to the modification example of the electron beam exposure apparatus 100 shown in FIG. 8. FIG. 9 shows part of the cross-section obtained by cutting the columns 120 shown in FIG. 8 along the PQRS-plane parallel to the XY-plane. In FIG. 9, the components that have substantially the same functions as the components of the electron beam lens apparatus 30 relating to the above-described embodiment are assigned with the same reference numerals and not described here. FIG. 9 shows an example where the columns 120 are arranged at a pitch of 30 mm in both the X- and Y-directions. FIG. 9 shows an example where each lens unit 40 has an outer diameter d2 of 30 mm.

A plurality of straight lines that pass centrally in the columns 120 and are perpendicular to the XY-cross-section are equivalent to the lens axes LA of the lens units 40 respectively constituting the columns 120. The lens units 40 each include the barrier 41, the excitation unit 42 and the magnetic member 43 that are concentrically arranged around the lens axis LA in the cross-section.

A supporting unit 50 is provided between the lens unit 40 of a given column 120 and the lens unit 40 of a column 120 adjacent to the given column 120. Stated differently, the lens unit 40 of each column 120 is in contact, at a portion of the outer peripheral portion thereof, with the corresponding portion of the supporting unit 50. If the pitch of the columns 120 remains substantially the same but the outer diameter of the lens unit 40 decreases, the interval between the adjacent ones of the columns 120 increases. In this case, the supporting unit 50 may be provided in a manner to fill the increased interval. Thus, the supporting units 50 each define the interval between the adjacent ones of the columns 120 in the XY-plane.

Figure 10:
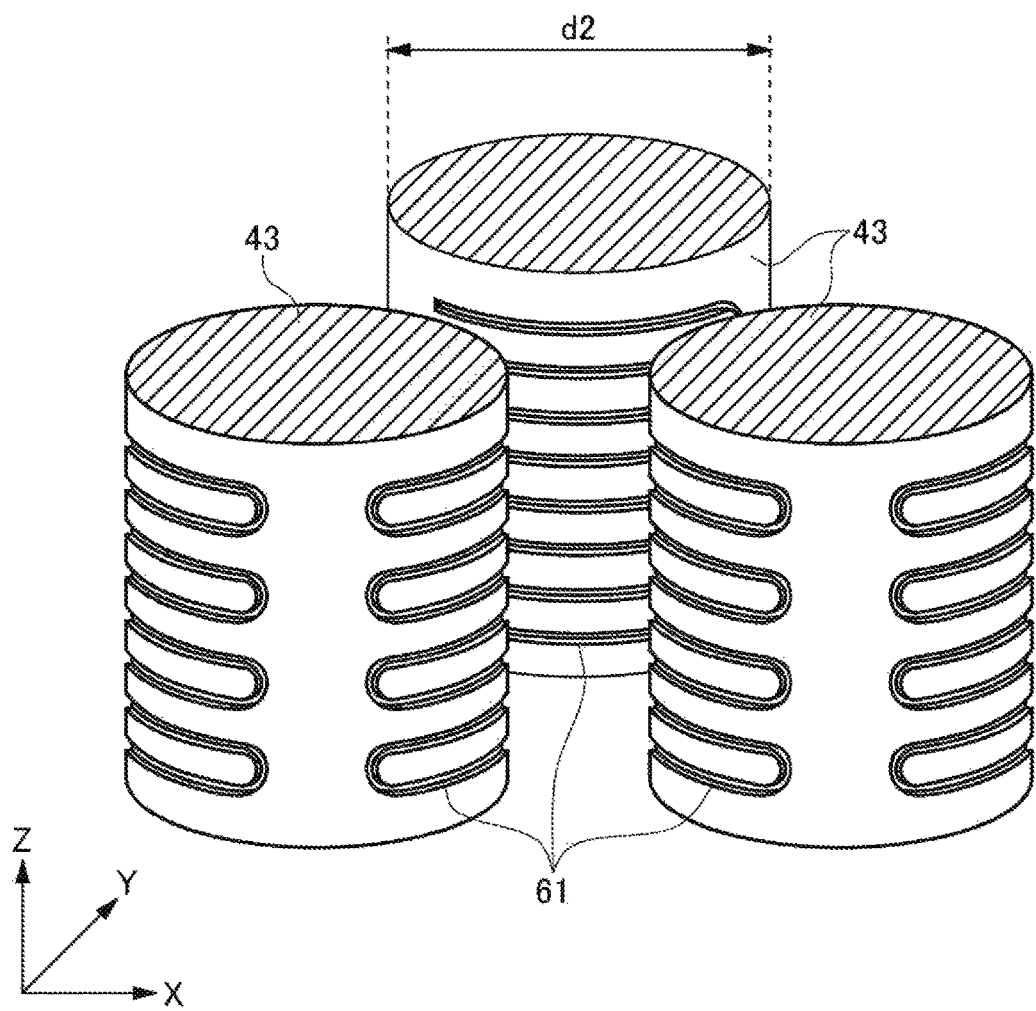
FIG. 10 is a perspective view showing a fifth modification example of the lens unit 40 relating to the embodiment of the present invention.

Since the supporting units 50 are in contact with the lens units 40 as described above, grooves 61 may be formed to allow a coolant fluid to flow along the outer peripheries of the lens units 40, in at least one of the outer peripheral portions of the lens units 40 that are in contact with the supporting units 50 and portions of the supporting unit 50 that are in contact with the lens units 40. Such lens units 40 are described with reference to FIG. 10. FIG. 10 is a perspective view showing a fifth modification example of the lens unit 40 relating to the embodiment of the present invention. FIG. 10 shows an exemplary structure of the lens unit 40 according to which the outer peripheral portion of the lens unit 40 that is in contact with the supporting unit 50 include the groove 61 through which the coolant fluid flows.

FIG. 10 is a perspective view showing the magnetic member 43 forming the outer periphery of the lens unit 40, and the groove 61, seen from the side of the supporting unit 50, which is not shown. In FIG. 10, the supporting units 50 are not shown, the lens units 40 have a diameter of less than 30 mm and the grooves 61 are made visible. FIG. 10 shows an example where four grooves 61 are symmetrically arranged in the outer peripheral portion of each magnetic member 43 that is in contact with the supporting units 50 so as to surround the magnetic member 43. The coolant fluid flowing through the four grooves 61 formed in each lens unit 40 is designed to eliminate the heat generated by each lens unit 40.

For example, when the electron beam exposure apparatus 100 includes 88 columns 120, the columns 120 collectively generate heat of 8.8 KW (=100 W×88) or higher. The generated heat is eliminated by the coolant fluid circulating through the grooves 61 provided in each of the (88) lens units 40. For example, the sum of the flow rates at which the coolant fluid circulates in the respective grooves 61 substantially reaches 530 mL/s (=1.5 mL/s×4×88). This is equivalent to a flow rate of substantially 32 L/m (liters per minute). The temperature regulator 160 regulates the cooling water to circulate at a total flow rate of substantially 32 L/m, against the difference in pressure of substantially $15 \times 10^3$ Pa between the inlet and the outlet, and regulates the elevated discharged water temperature To from substantially 40° C. to 20° C.

In the above-described manner, the electron beam exposure apparatus 100 including a plurality of columns 120 can also have flow channels through which a coolant fluid flows formed therein without changing the size of each column 120, for example, the outer diameter, and can thus achieve improved heat eliminating capability. FIG. 10 illustrates an example where the grooves 61 are formed in the outer peripheral portions of the magnetic members 43 that are in contact with the supporting units 50 in the plurality of lens units 40. In the lens units 40, however, the grooves 61 may be alternatively formed in at least one of the first member 71 and the second member 72 constituting each lens unit 40, as shown in FIGS. 3, 4, 5 and 6.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A charged particle beam lens apparatus comprising:
   a lens unit positioned around a through hole through which a charged particle beam travels, the lens unit being configured to converge or diffuse the charged particle beam; and
   a supporting unit surrounding the lens unit, wherein
   at least one of an outer peripheral portion of a magnetic member of the lens unit that is in contact with the supporting unit and an inner peripheral portion of the supporting unit that is in contact with the magnetic member of the lens unit includes a groove through which a coolant fluid flows in direct contact with the magnetic member along an outer periphery of the lens unit.

2. The charged particle beam lens apparatus as set forth in claim 1, wherein
   the outer peripheral portion and the inner peripheral portion are at least part of a plane parallel to an extending direction of the through hole.

3. The charged particle beam lens apparatus as set forth in claim 1, wherein
   the groove is symmetrically formed with respect to a plane that passes through an axis on which the through hole centers.

4. The charged particle beam lens apparatus as set forth in claim 1, further comprising:
   an inlet connected to one end of the groove; and
   an outlet connected to another end of the groove, wherein
   the groove receives the coolant fluid through the inlet and discharges the coolant fluid through the outlet.

5. The charged particle beam lens apparatus as set forth in claim 4, wherein
   the inlet is positioned on a charged particle beam exit side of the lens unit, and
   the outlet is positioned on a charged particle beam entrance side of the lens unit.

6. The charged particle beam lens apparatus as set forth in claim 4, further comprising:
   an inlet-side fluid tank connected to the inlet to feed the coolant fluid through the inlet; and
   an outlet-side fluid tank connected to the outlet to receive through the outlet the discharged coolant fluid that has traveled through the groove.

7. The charged particle beam lens apparatus as set forth in claim 4, comprising:
a plurality of the grooves;
a plurality of the inlets respectively corresponding to the plurality of grooves; and
a plurality of the outlets respectively corresponding to the plurality of grooves.

8. The charged particle beam lens apparatus as set forth in claim 1, wherein
the lens unit is shaped like a cylinder centering around an axis parallel to an extending direction of the through hole and has an outer diameter of no less than 22 mm and no more than 30 mm.

9. The charged particle beam lens apparatus as set forth in claim 1, wherein
as the coolant fluid, cooling water principally including water flows through the groove.

10. The charged particle beam lens apparatus as set forth in claim 9, wherein
the groove has a cross-sectional area of no less than 0.5 mm$^2$ and no more than 1 mm$^2$ and has a length of no less than 0.7 m and no more than 1.5 m.

11. A charged particle beam column comprising:
a particle source configured to emit a charged particle beam; and
the charged particle beam lens apparatus as set forth in claim 1.

12. A charged particle beam exposure apparatus comprising at least one of the charged particle beam columns as set forth in claim 11.

13. The charged particle beam lens apparatus as set forth in claim 1, wherein
the groove is a spiral groove spiraling around the magnetic member.

14. The charged particle beam lens apparatus as set forth in claim 1, wherein
the lens unit is one of a plurality of lens units forming an objective lens closest to a sample.

15. A charged particle beam lens apparatus comprising:
a lens unit positioned around a through hole through which a charged particle beam travels, the lens unit being configured to converge or diffuse the charged particle beam; and
a supporting unit surrounding the lens unit, wherein
the lens unit includes:
a first member positioned around the through hole; and
a magnetic member surrounding the first member, and
at least one of an outer peripheral portion of the magnetic member that is in contact with the supporting unit and an inner peripheral portion of the supporting unit that is in contact with the magnetic member includes a groove through which a coolant fluid flows in direct contact with the magnetic member along an outer periphery of the magnetic member.

16. The charged particle beam lens apparatus as set forth in claim 15, wherein
the lens unit includes a barrier defining the through hole,
the first member is an excitation unit configured to generate magnetic field in an extending direction of the through hole, and
the magnetic member is configured to regulate a direction of a magnetic field generated by the excitation unit.

* * * * *